United States Patent [19]

Tentarelli

[11] 4,028,634

[45] June 7, 1977

[54] FEED-FORWARD AMPLIFIER WITH SIMPLE RESISTIVE COUPLING

[75] Inventor: Kenneth Donald Tentarelli, Atkinson, N.H.

[73] Assignee: Bell Telephone Laboratories, Incorporated, Murray Hill, N.J.

[22] Filed: Feb. 11, 1976

[21] Appl. No.: 657,087

[52] U.S. Cl. .................................. 330/151; 330/26; 330/30 R; 330/149
[51] Int. Cl.² .......................................... H03F 1/00
[58] Field of Search ............... 330/124 R, 149, 151, 330/26, 30 R

[56] References Cited
UNITED STATES PATENTS

| | | | |
|---|---|---|---|
| 2,662,126 | 12/1953 | Henson | 330/124 |
| 3,202,928 | 8/1965 | Prior | 330/124 |
| 3,471,798 | 10/1969 | Seidel | 330/149 |
| 3,541,467 | 11/1970 | Seidel | 330/124 |
| 3,667,065 | 5/1972 | Beurrier et al. | 330/124 |
| 3,725,806 | 4/1973 | Darlington | 330/149 |
| 3,815,040 | 6/1974 | Seidel | 330/149 |

*Primary Examiner*—Rudolph V. Rolinec
*Assistant Examiner*—Lawrence J. Dahl
*Attorney, Agent, or Firm*—Joseph A. Cameron

[57] ABSTRACT

Feedback amplifiers having zero or infinite input and output impedances are used as the main amplifier and error amplifier elements of a feed-forward amplifier system. This allows the required impedance matching with simple resistive coupling networks rather than the complicated couplers heretofore required.

The use of both series and shunt feedback provides convenient coupling points for the proper phase relationship between combining signals, and the unidirectional conductivity of the amplifier transistors supplies the directionality usually required of the couplers.

7 Claims, 4 Drawing Figures

4,028,634

FEED-FORWARD AMPLIFIER WITH SIMPLE RESISTIVE COUPLING

BACKGROUND OF THE INVENTION

This invention relates to broadband amplifiers which use feed-forward techniques to reduce distortion. According to well-known feed-forward principles, a sample of an amplifier's output signal is compared with a sample of its input signal. The difference, which is proportional to the error introduced by the amplifier, is amplified and subtracted from the output signal to thereby reduce distortion. The feed-forward technique therefore requires signal splitting at the input and output of the main amplifier and signal combining at the input and output of the error amplifier. Because of the frequencies involved in broadband transmission, the coupling devices used for the signal splitting and combining must maintain matched impedances as well as a specific power dividing ratio. In addition, in order to prevent amplifier instability, due to regenerative feedback, they must be directional in nature. Broadband directional couplers with specific impedance matching however, are difficult to design, and therefore expensive.

An object of this invention is a broadband feed-forward amplifier which does not require specific couplers.

A second object is a broadband feed-forward amplifier which uses feedback amplifier elements to allow impedance matching with simple resistive coupling networks.

SUMMARY OF THE INVENTION

This invention is based on the recognition that if the input or output impedance of an amplifier is substantially zero, simple resistance may be added in series to effect impedance matching that is not frequency sensitive. Similarly, if the input or output impedance is substantially infinite, simple resistances may be added in shunt to effect similar broadband impedance matching. The added resistances may then be used as parts of simple dividing or combining networks.

A feed-forward amplifier, therefore, according to the invention, comprises a main amplifier having an input impedance and an output impedance for amplifying an input signal, and an error amplifier having an input impedance and an output impedance, each of which impedances is substantially zero or infinite, nonreactive sampling means for coupling signals proportional to the input signal and the amplified signal to the error amplifier, and nonreactive combining means for combining the outputs of the main amplifier and the error amplifier to produce an output signal in which the error introduced by the main amplifier is substantially cancelled.

DETAILED DESCRIPTION

Figure 1:
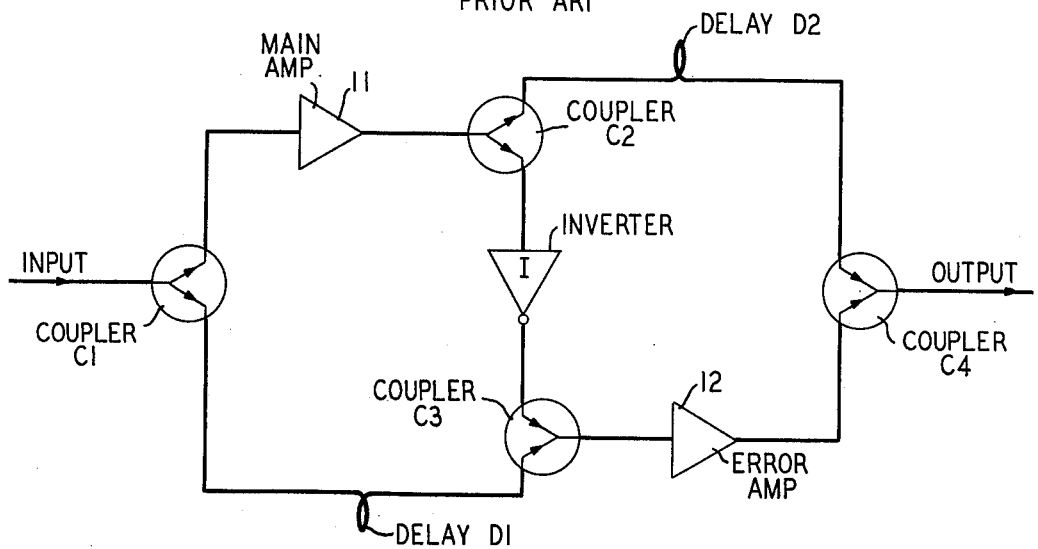
FIG. 1 is a block diagram of an amplifier illustrative of the prior art.

In order to appreciate the operation and the advantages of the invention, it might be well to consider the feed-forward amplifier of the prior art, shown in block form in FIG. 1. In that representative circuit, the input signal is split in a coupler C1. A portion of the split signal is fed to the main amplifier 11, where it is amplified with the inherent addition of the distortion which the feed-forward technique is designed to eliminate. The output of the main amplifier is split in coupler C2, with a small portion of the amplified and hence distorted signal fed to coupler C3. The second portion of the input signal separated by coupler C1 is fed to the other input of coupler C3 after having been delayed in delay network D1 an appropriate length of time to arrive at coupler C3 exactly out-of-phase with the signal portion from coupler C2. If the amplifiers do not invert their respective input signals, an inverter or phase shift network may be inserted between couplers C2 and C3 to aid in the necessary phase adjustment. Coupler C3 effectively subtracts the input signal portion from the amplified signal portion. If the couplers are precisely designed to effect signal splitting and combining in the proper ratios, the signal out of coupler C3 will be a replica of the distortion or error introduced into the amplified signal by the main amplifier. The error signal thus separated is amplified by the error amplifier 12 and fed to coupler C4. The main portion of the amplified signal from coupler C2 is fed to the other input of coupler C4 after an appropriate delay in introduced by network D2. With the proper amplitudes and phases of the signals into coupler C4, the error signal will be subtracted from the main amplified signal to produce a distortion-free output signal.

It can be seen that in a feed-forward amplifier system, signal loop balance, that is, the maintenance of relative amplitudes and phases of the combined and split signals to provide accurate error isolation and cancellation is of the utmost importance in determining the amplifier transmission response. Where broadband amplification is desired, it is important that the signal loop balance be maintained uniformly across the whole transmission band. The requirement for couplers which match impedances to eliminate reflections and which maintain uniform phase shift and signal division ratios throughout the whole range of transmitted frequencies is understandably very difficult to fulfill.

Figure 2:
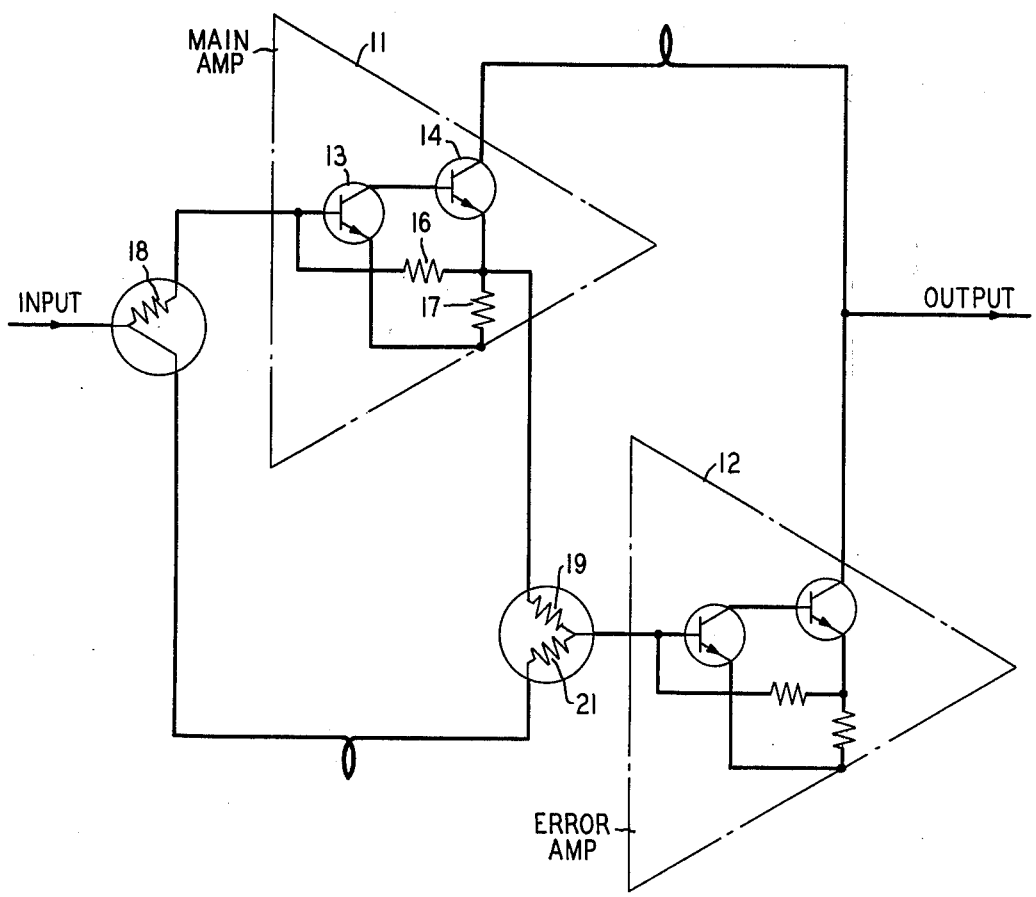
FIG. 2 is a partly block, partly schematic diagram of an embodiment of the invention.

The feed-forward amplifier system of FIG. 2, illustrative of an embodiment of the invention, utilizes features of a well-known feedback amplifier to eliminate the need for such special couplers. In FIG. 2, main amplifier 11 and error amplifier 12 are each dual current feedback amplifiers. Main amplifier 11 includes transistors 13 and 14 connected in common emitter cascade configuration. That is, the collector of transistor 13 is connected to the base of transistor 14. A first feedback resistor 16 is connected between the emitter of output transistor 14 and the base of input transistor 13. A secod feedback resistor 17 is connected between the emitter of output transistor 14 and ground. Because the feedback is shunt (or current) feedback at the input, and series (or current) feedback at the output, these amplifiers are alternatively known as shunt series feedback amplifiers or current feedback pairs. As is well known, this feedback arrangement produces substantially zero amplifier input impedance, and substantially infinite amplifier output impedance. This facilitates impedance matching together with signal splitting and combining; at substantially zero impedance, currents may be added directly and series resistance may be added for impedance match; at substantially infinite impedance, voltages may be added directly and shunt resistance may be added for impedance match. Couplers C1 and C3 of FIG. 1 are therefore easily replaced by resistor 18, 19 and 21 in the arrangement of FIG. 2 and the outputs of the main and error amplifiers may be directly paralleled to eliminate coupler C4. Finally, the series feedback at the output of the main amplifier facilitates signal splitting at that point by providing a ready current source of the proper phase to combine with the input signal to derive the error signal. The unilateral conductivity of output transistor 14 provides the directionality required to avoid regenerative feedback via error amplifier 12. All of the functions of directional coupler C2 of FIG. 1 are therefore provided, and coupler C2 may be eliminated.

Figure 3:
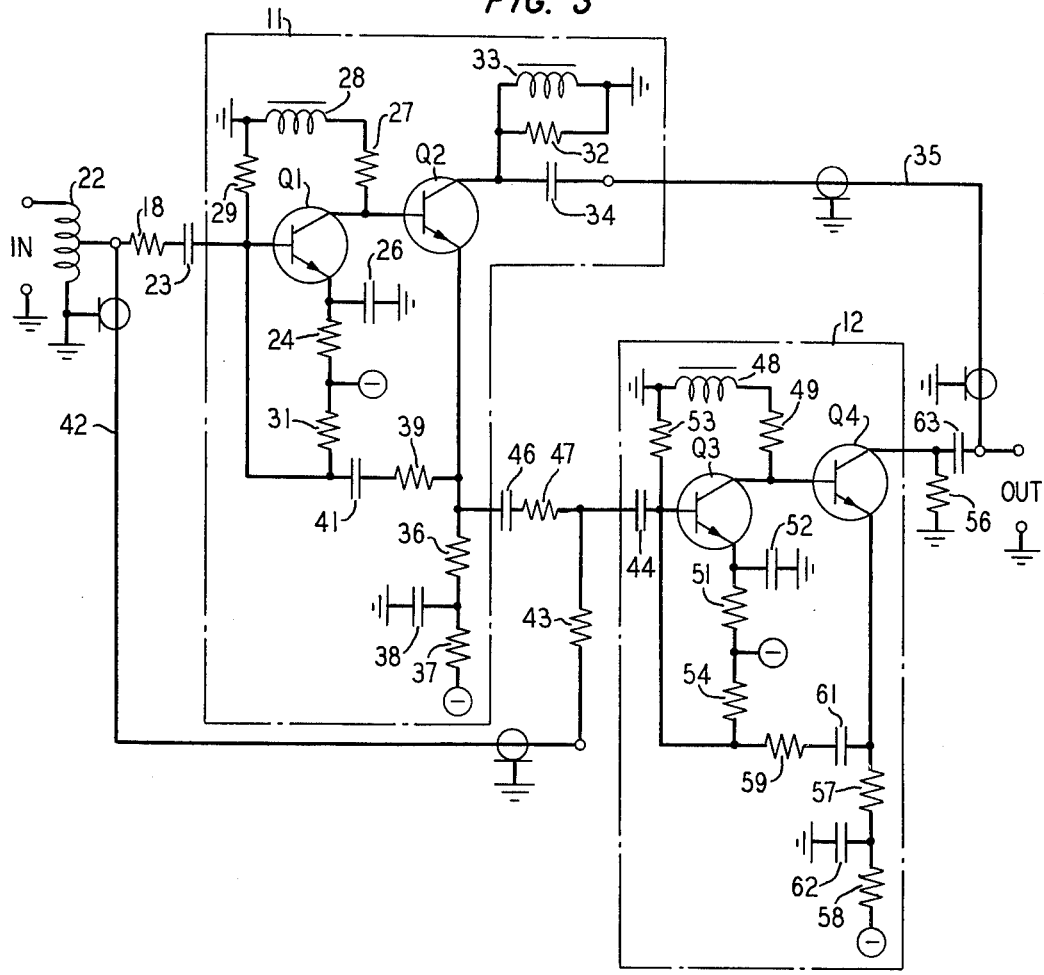
FIG. 3 is a schematic diagram of a particularly useful embodiment of the invention.

A particularly advantageous embodiment of the invention is shown in the schematic diagram of FIG. 3. As in FIG. 2, the embodiment of FIG. 3 utilizes current feedback pairs for both the main amplifier 11 and the error amplifier 12. The input signal to be amplified is applied across autotransformer 22. The signal from the tap of transformer 22 is applied to the base of the input transistor Q1 of main amplifier 11 through resistor 18 and blocking capacitor 23. The emitter of transistor Q1 is connected to the negative power source through bias resistor 24. The emitter is a.c. grounded through coupling capacitor 26. The collector of transistor Q1 is connected to the grounded power return through collector resistor 27 and RF choke 28. Direct current bias is supplied to the base of transistor Q1 by resistor 29 connected to ground and resistor 31 connected to the negative power supply. The collector of Q1 is also connected to the base of output transistor Q2. The parallel combination of a resistor 32 and a choke 33 connects the collector of transistor Q2 to ground, and the output signal from Q2 is connected to the amplifier output through coupling capacitor 34 and delay line 35. Feedback resistor 36 and bias resistor 37 are connected in series between the emitter of Q2 and negative power supply. Coupling capacitor 38 a.c. grounds the junction between resistors 36 and 37, and shunt feedback is provided between the emitter of Q2 and the base of transistor Q1 by feedback resistor 39 and coupling capacitor 41. A sample of the input signal is coupled to the base of the input transistor Q3 of error amplifier 12 by delay line 42, coupling resistor 43 and coupling capacitor 44. A sample of the output signal from the main amplifier is coupled from the emitter of transistor Q2 to the junction between resistor 43 and capacitor 44 via coupling capacitor 46 and coupling resistor 47.

Although it will usually handle a much lower signal amplitude, error amplifier 12 may also be a current feedback pair. Power is fed to the collector of input transistor Q3 from ground through a choke 48 and collector resistor 49; the emitter of transistor Q3 is connected to the negative power source through emitter resistor 51, the emitter being a.c. grounded through coupling capacitor 52. Direct current bias is provided to the base of transistor Q3 by the voltage divider made up of resistors 53 and 54 connected across the negative power supply. Power is supplied to the output transistor Q4 from ground through collector resistor 56, the collector and emitter of transistor Q4, series feedback resistor 57 and bias resistor 58. Shunt feedback is provided from the emitter of Q4 to the base of Q3 by feedback resistor 59 and coupling capacitor 61. The lower end of series feedback resistor 57 is a.c. grounded through coupling capacitor 62 and the output from the error amplifier is coupled to that from the main amplifier through coupling capacitor 63.

The design of current feedback pairs such as amplifiers 11 and 12 is quite well known in the art and is described, for example, in the text *Amplifying Devices and Low-Pass Amplifier Design*, by E. M. Cherry and D. E. Hooper (Wiley & Sons, 1968) Chapter 14.4.

The choice of values for resistors 18 and 43 to provide impedance matching and appropriate signal splitting is straightforward. Since the impedance at the base of transistor Q1 and at the base of transistor Q3 is substantially zero, the ratio of the values of resistors 18 and 43 determines the current split of the input signal between the main and error amplifier, while the resistance of the parallel combination of resistors 18 and 43 may be chosen to match the source impedance. Input transformer 22 is therefore not necessary in order to practice the invention. However, since the value of resistor 18 largely determines the noise generated in amplifier 11, it can be useful to lower the source impedance by transformer 22, and therefore lower the value of resistor 18 and the noise generated by it.

Delay line 42 may be an appropriate length of coaxial cable, for instance, and should be chosen to match the impedance of resistor 43. Feedback resistors 36 and 39 control the gain of main amplifier 11 and the signal voltage across resistor 36. The value of resistor 47 is therefore chosen in conjunction with the feedback resistors to provide the exact amount of fundamental signal from amplifier 11 to just balance that from the input through resistor 431, so that only the error signal is fed to amplifier 12. Since the impedance at the collectors of Q2 and Q4 is substantially infinite, resistors 56 and 32 are easily chosen so that their parallel combination matches the impedance of the load. The impedance of delay line 35, of course, matches resistor 32. The feedback resistors of amplifier 12, resistors 57 and 59 are, of course, designed to provide the proper amplifier gain to completely cancel the distortion of amplifier 11. In summary, although the amplifier gains and the coupling resistors all affect signal loop balance, there are sufficient degrees of freedom to accomplish straightforward design. Furthermore, because the coupling devices are frequency insensitive resistors, and the amplifiers are simple and stable feedback amplifiers, signal loop balance over a broad range is easily attained.

It is, of course, not necessary to use current feedback pairs for the amplifiers in order to practice the invention. Other amplifying elements which produce substantially zero or infinite input or output impedances will operate to allow the simple resistive coupling described herein. The amplifiers may, for example, have a single amplification stage or several stages. Two stage amplifying elements were found particularly advantageous because they can have sufficient gain for practical broadband application, yet they produce a minimum of troublesome phase shift.

Figure 4:
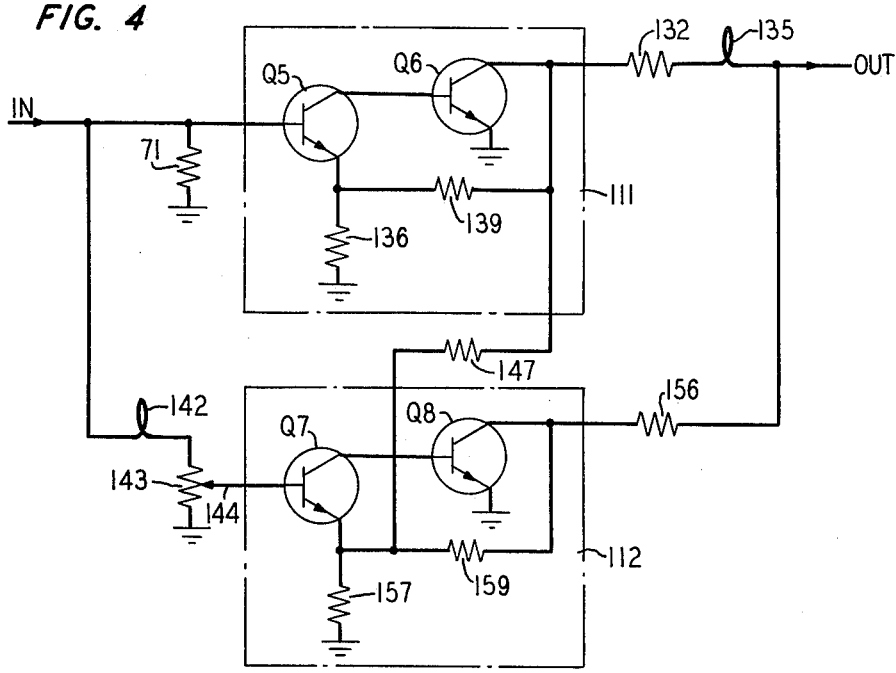
FIG. 4 is a schematic diagram illustrative of another embodiment of the invention.

The use of voltage feedback pairs, on the other hand, may be as advantageous as the use of current feedback pairs. A feed-forward arrangement using voltage feedback pairs is illustrated in the simplified schematic diagram of FIG. 4. The voltage feedback pair is also made up of two common-emitter stages in cascade. The input stage however, utilizes series feedback and the output stage utilizes shunt feedback. As a consequence, the input impedance is substantially infinite and the output impedance is substantially zero. In the circuit of FIG. 4, main amplifier 111 includes two transistors, Q5 and Q6, and error amplifier 112 includes two transistors, Q7 and Q8. The input signal is introduced directly to the base of transistor Q5. It is also fed through a delay line 142 to a tapped resistor 143. A sample of the input signal taken from tap 144 of resistor 143 is fed to the base of Q7. A series feedback resistor 136 is connected between the emitter of transistor Q5 and ground, and a shunt feedback resistor 139 is connected between the collector of Q6, and the emitter of transistor Q5. In a similar manner, a feedback resistor 157 connects the emitter of transistor Q7 to ground and a shunt feedback transistor 159 connects the collector of transistor Q8 to the emitter of transistor Q7. The output of main amplifier 111 is connected to the output of the feed-forward amplifier via a resistor 132 and a delay line 135, and the collector of transistor Q8 is connected to the output of the feed-forward amplifier via a resistor 156. A coupling resistor 147 connects the collector of transistor Q6 and the emitter of transistor Q7.

The design of voltage feedback pairs is also described in Chapter 14.4 in the Cherry and Hooper text. It will be noted that since the input impedance of the voltage feedback pair is substantially infinite, the source impedance may be matched by the parallel combination of tapped resistor 143 and a resistor 71 connected between the base of transistor Q5 and ground. The amplified signal sample is taken from the collector of transistor Q6 and fed to the emitter of transistor Q7 to provide the proper phase for error derivation. Finally, since the output impedance of voltage feedback pairs is substantially zero, series resistors 132 and 156 are connected between the main and error amplifiers, respectively, and the feed-forward amplifier output to match the load impedance.

The structure of FIG. 4 has the advantage that the distortion generated in the base-collector junction of transistor Q6 is included in the amplified signal sample and therefore compensated for. This is not the case in the structure of FIG. 3, where the amplifying signal sample is taken from the emitter of transistor Q2. This advantage may be more than offset, however, in that voltage feedback pairs have been traditionally more difficult to design for broadband applications than current feedback pairs. It should also be noted that in the feed-forward amplifier of FIG. 4, there are two parallel feedback paths from the collector of transistor Q8 to the emitter of transistor Q7; feedback resistor 159 is shunted by the series combination of resistor 156, delay network 135, resistor 132 and resistor 147. This should be taken into account in the design of error amplifier 112.

The feed-forward amplifier thus described utilizes the impedance characteristics of well-known feedback amplifiers to eliminate the need for expensive couplers.

The invention is not limited to the particular circuits described herein, however, other configurations will occur to those skilled in amplifier design which do not depart from the spirit and scope of the invention.

What is claimed is:
1. A feed-forward amplifier for amplifying electromagnetic wave signals comprising:
   signal splitting means for dividing an input signal into first and second portions and applying said portions to first and second paths, respectively,
   said first path including a main amplifier for producing an amplified replica of said input signal,
   said amplified replica inherently including error components introduced by said main amplifier,
   signal tapping means connected to said main amplifier for tapping off a portion of said amplified replica and applying it to a third path,
   first signal combining means connected to said second and third paths for effecting subtraction of said second input signal portion from said amplified replica portion to produce an error signal substantially proportional to said error components, and for preventing feedback from said third path to said second path,
   error amplifying means connected to said first signal combining means for amplifying said error signal, and
   second signal combining means connected to said first path and said error amplifying means for effecting subtraction of said error components from said amplified replica to produce a substantially distortion-free output signal,
CHARACTERIZED IN THAT
   said main amplifier has an output port with substantially zero output impedance,
   said signal tapping means comprises a resistive splitting junction formed at said output port,
   said error amplifying means has an input port with substantially zero input impedance, and
   said first signal combining means comprises a resistive summing junction formed at said input port,
   said third path introducing substantially zero phase shift between said output and input ports.
2. A feed-forward amplifier as in claim 1 wherein said main amplifier has a second output port of opposite phase from said first mentioned output port, said second signal combining means being connected to said second output port.
3. A feed-forward amplifier as in claim 2 wherein said main amplifier comprises a current feedback pair having an output transistor, said summing junction being formed at the emitter and said second output port comprising the collector of said output transistor.
4. A feed-forward amplifier as in claim 3 wherein said error amplifying means comprises a second current feedback pair.
5. A feed-forward amplifier as in claim 1 wherein said second path includes a second input port of said error amplifier of opposite phase from said first mentioned input port.
6. A feed-forward amplifier as in claim 5 wherein said error amplifying means comprises a voltage feedback pair having an input transistor, said summing junction being formed at the emitter and said second input port comprising the base of said input transistor.
7. A feed-forward amplifier as in claim 6 wherein said main amplifier comprises a second voltage feedback pair.

* * * * *